United States Patent [19]

Romero et al.

[11] Patent Number: 5,707,484

[45] Date of Patent: Jan. 13, 1998

[54] METHOD OF ACCURATE COMPOSITIONAL ANALYSIS OF DIELECTRIC FILMS ON SEMICONDUCTORS

[75] Inventors: Jeremias D. Romero, San Jose; Roger L. Alvis, Cupertino; Homi Fatemi, Los Altos Hills, all of Calif.

[73] Assignee: Advaned Micro Devices, Inc., Sunnyvale, Calif.

[21] Appl. No.: 539,029

[22] Filed: Oct. 4, 1995

[51] Int. Cl.$^6$ .................................................. H01L 21/306
[52] U.S. Cl. ........................................ 156/626.1; 437/225
[58] Field of Search .................... 437/225; 156/626.1; 427/38

[56] References Cited

U.S. PATENT DOCUMENTS

| | | | |
|---|---|---|---|
| 4,372,803 | 2/1983 | Gigante | 156/426.1 |
| 4,679,946 | 7/1987 | Rosencwaig et al. | 374/5 |
| 4,960,656 | 10/1990 | Chang et al. | 428/704 |
| 4,992,299 | 2/1991 | Hochberg et al. | 427/38 |
| 5,277,769 | 1/1994 | Medernach | 204/129.3 |
| 5,536,359 | 7/1996 | Kawada et al. | 156/626.1 |

OTHER PUBLICATIONS

Wong et al., "A Study Of Buried Silicon Nitride Layers Formed By Nitrogen Implantation With a Stationary Beam", Nuclear Instruments and Methods in Physics Research, vol. B17, No. 2, Sep. 1986, North–Holland, Amsterdam, pp. 122–126.

*Primary Examiner*—Nam Nguyen
*Assistant Examiner*—Anita Alanko
*Attorney, Agent, or Firm*—H. Donald Nelson

[57] ABSTRACT

A method of accurately determining the composition of a dielectric film in a semiconductor device by performing a compositional analysis on a film only portion of the semiconductor device.

5 Claims, 2 Drawing Sheets

5,707,484

METHOD OF ACCURATE COMPOSITIONAL ANALYSIS OF DIELECTRIC FILMS ON SEMICONDUCTORS

BACKGROUND OF THE INVENTION

1. Field of the Invention

This invention relates generally to semiconductor wafer manufacturing, and more particularly, to a method of accurately determining the composition of a film on a semiconductor device.

2. Discussion of the related art

The rapid growth of technological requirements and the worldwide acceptance of sophisticated electronic devices have created an unprecedented demand for large-scale, complex, integrated circuits. Meeting these demands has required technological advances in materials and processing equipment, significant increases in the number of individuals involved in integrated circuit design, process technology developments, and testing of semiconductor devices. In addition, there is an increased emphasis on effectively utilizing sophisticated test instruments to aid in the analysis of the manufacturing process so that the circuit design process can be improved in order to increase the performance and reliability of the final product.

In order for the circuit designer and process engineer to have the flexibility needed to optimize integrated circuit design, it is necessary for both the circuit designer and the process engineer to have available precise information regarding processing and fabrication technology and how changes in processing and fabrication technology impact the final product.

The fabrication of a semiconductor is a complex process involving many steps and procedures. It is becoming mandatory that there be available testing methods to precisely measure certain parameters during the processing cycle to ensure that the processing cycle has not gone awry.

The major steps involved in producing integrated circuit (ICs) includes the deposition of films of various materials that must be applied to the wafer during processing. These films are often very thin and can range from 200 Å or less up to 20µ. The various films that are deposited include insulators, resistive films, conductive films, dielectrics, n- and p-type semiconductor materials, and dopants that are subsequently forced deeper into the substrate.

Because the deposition step is one of the major steps in the manufacturing process of fabricating semiconductors and because of the important functions of the deposited films it is critical that the films are deposited as designed. In addition, the proper functioning of the films is dependent upon the proper composition of the films. For example, an impure film can cause a degradation in performance of the semiconductor device up to and including failure.

In view of the above, it is mandatory that there is available a test procedure that will give the process engineer rapid accurate feedback concerning the manufacturing process and in case of product failures a method to determine whether impurities in the various dielectric films in the semiconductor device contributed to, or caused the failures.

SUMMARY OF THE INVENTION

A method of accurately determining the composition of a dielectric film in a semiconductor device by performing a compositional analysis on a film only portion of a semiconductor device.

The film only portion of the semiconductor device is provided by removing the substrate from behind the film, by first creating a crater in the substrate and then selectively etching the remaining substrate from the center of the crater.

The compositional analysis may be by spectral analysis, infrared spectral analysis, or by Fourier transform spectral analysis.

The present invention is better understood upon consideration of the detailed description below, in conjunction with the accompanying drawings. As will become readily apparent to those skilled in this art from the following description there is shown and described a preferred embodiment of this invention simply by way of illustration of one of the modes best suited to carry out the invention. As it will be realized, the invention is capable of other different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION OF THE PREFERRED EMBODIMENT

Figure 1:
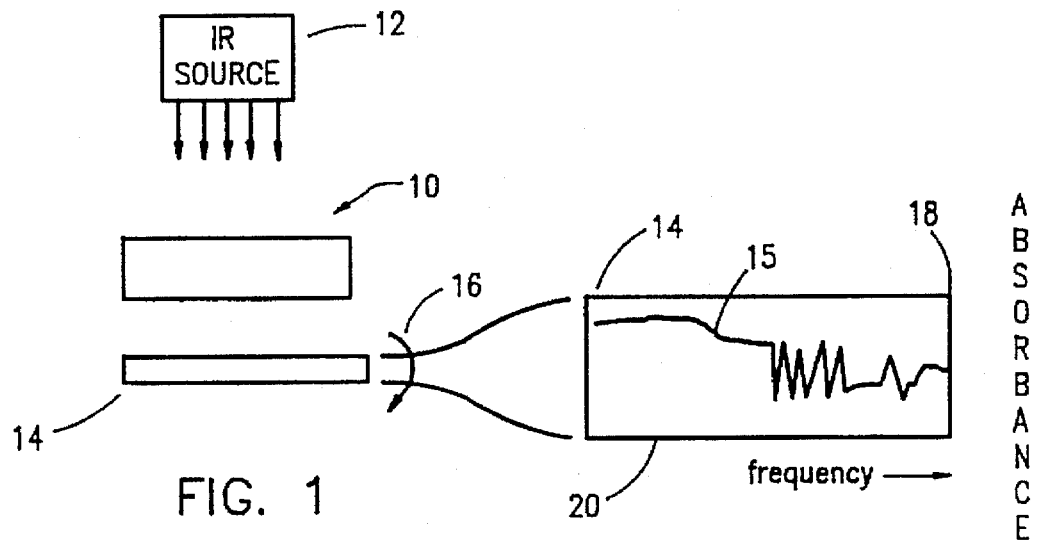
FIG. 1 depicts, in general, the method of infrared spectroscopy.

Referring now to FIG. 1, there is shown a general depiction of the infrared spectroscopy method used to obtain a composition analysis of a material. In this method, there is provided a sample 10 of the material to be analyzed, a source of infrared radiation 12, and an infrared detector 14 to record the amount of the infrared radiation passed through the sample (or conversely to allow a determination of how much of the infrared radiation was absorbed by the sample). Infrared spectroscopy is based on the fact that almost any compound having covalent bonds, whether organic or inorganic, will be found to absorb various frequencies of electromagnetic radiation in the infrared region of the spectrum. In this case the method represents FTIR (Fourier transform infrared spectroscopy) in which a sample is irradiated with a complete infrared spectrum and the complex wave function (interferogram) is transformed into an optical spectrum (signal versus frequency). This wave function is digitally recorded from the infrared detector 14 which is shown rotated by arrow 16 for illustrative purposes. The resulting optical spectrum is either viewed on a computer monitor and/or plotted by a printer. The wave function 15 is recorded as absorbance on the vertical axis 18 versus frequency on the horizontal axis 20. As can be appreciated by one skilled in the infrared spectra technology, the sample can also be scanned by conventional infrared spectral analysis procedures, that is, scanning the sample, one frequency or by a band of frequencies at a time, until the sample has been irradiated by the full infrared spectrum.

Figure 2A:
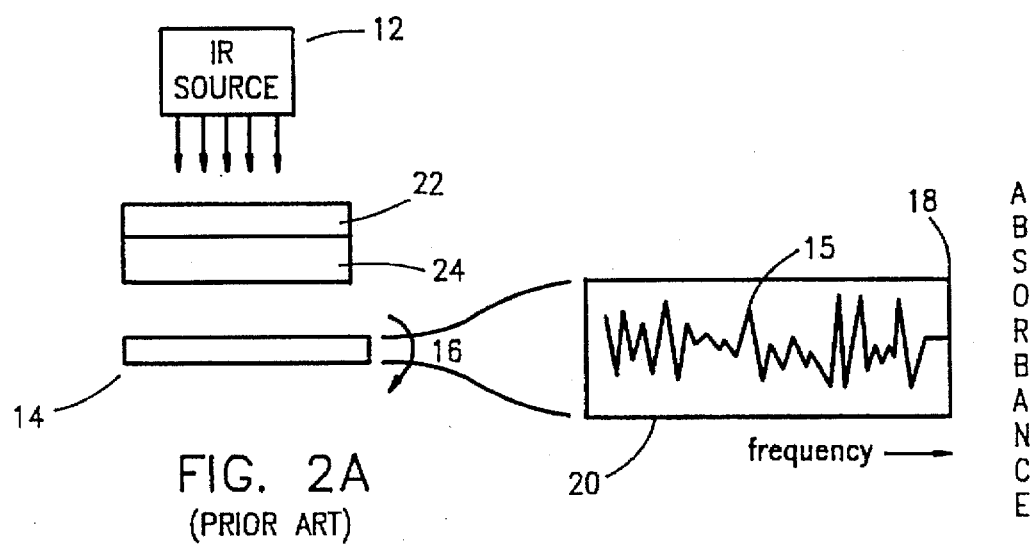
FIGS. 2A and 2b show how the prior art determines the composition of a film on semiconductor.
Figure 2B:
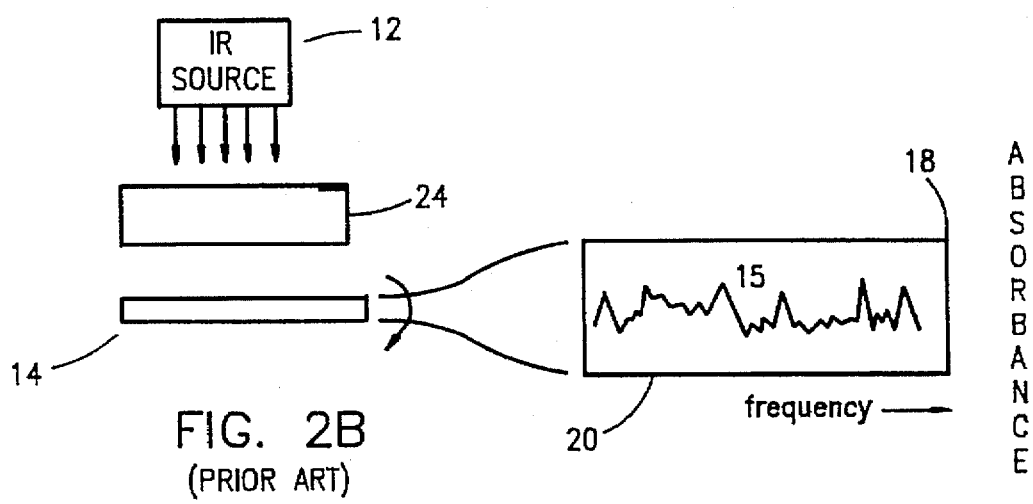

Referring now to FIG. 2A and 2B there is a depiction of the prior art method of determining the composition of a film 22 on a semiconductor 24. In this case the wave function 15 represents the amount of radiation absorbed by both the film 22 and the semiconductor 24. To obtain the composition of film 22 it is then necessary to account for the radiation absorbed by semiconductor 24. This is done in the prior art by obtaining a second spectrum from only a semiconductor 24 as shown in FIG. 2B. In this case the wave function 15 represents the amount of radiation absorbed by the semiconductor 24. To obtain the compositional information of film 22 it is then necessary to subtract mathematically the spectrum shown in FIG. 2B from that shown in FIG. 2A. Although this technique provides rapid analysis because there is no sample preparation there are disadvantages. First, there is no assurance that the semiconductor only sample used in the measurement shown in FIG. 2B is a perfect match to that of the semiconductor 24 used in the measurement shown in FIG. 2A. Because of this the resulting spectra may be distorted and may provide inaccurate results, if in fact, the samples are not the same composition. A second disadvantage is that a physical phenomenon called multiple internal reflections occur between the film and the semiconductor interface and causes a sloping baseline and a wavy pattern in the spectrum. These artifacts cause inaccurate results and prevent an accurate interpretation of the resulting spectrum.

Figure 3:
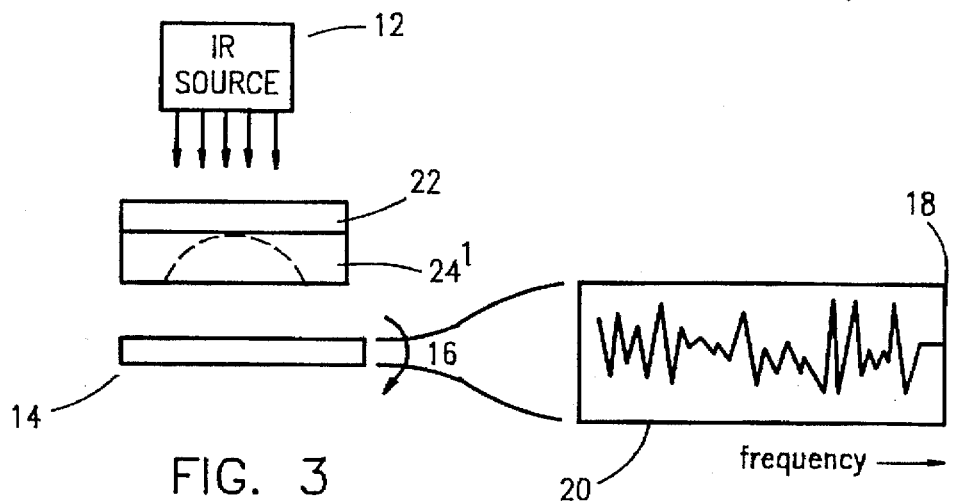
FIG. 3 shows the method of the present invention.
Figure 4:
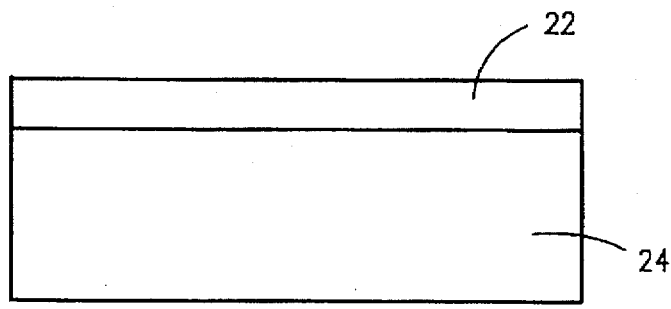
FIGS. 4, 5, and 6 illustrate the preparation of the sample used in the method of the present invention.
Figure 5:
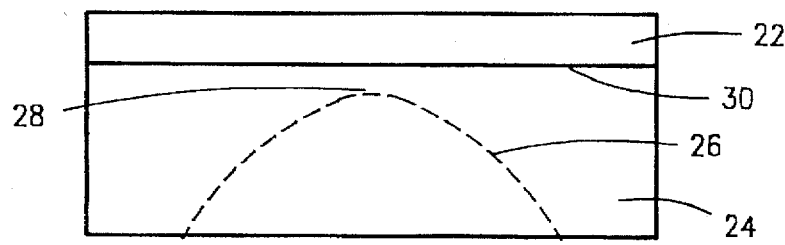
Figure 6:
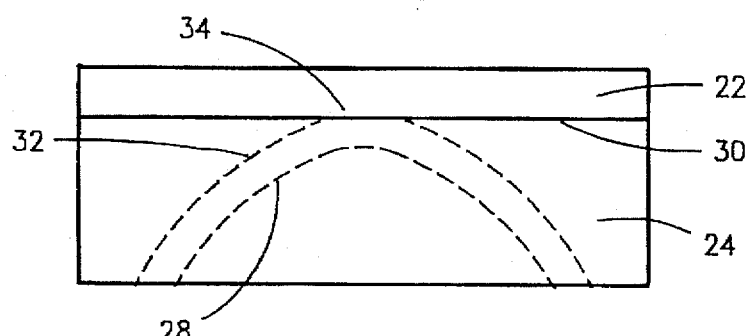

Referring now to FIG. 3 there is depicted the method of the present invention with a semiconductor 24' modified to allow a "film" only spectrum to be obtained. Referring to FIGS. 4, 5, and 6 there is shown a sample preparation procedure which will provide the "film" only sample for analysis. FIG. 4 represents a three millimeter disk cut from a wafer using an ultrasonic cutting tool. The semiconductor is ground using a dimpler tool to provide a crater represented at 26, FIG. 5. The crater 26 is ground until the center of the crater 28 is approximately 15μ from the film/semiconductor boundary 30. The crater 26 is then chemically etched to remove the remaining semiconductor material around the center of the crater 28. Upon completion of the etch the crater will have the shape shown by 32. One method of accomplishing the chemical etch is to apply a melted wax to the portion of the semiconductor that is not to be etched. The sample is then placed in a 30% KOH solution that is heated to about 55° C. Isotropic etching of the semiconductor will then occur on surfaces not protected by the wax. Because the center of the crater 28 is the thinnest, approximate 15μ as discussed above, that area will clear first. The etch is continued until the diameter of the film that is exposed represented at 34 attains a diameter of 0.5 mm to 1 mm area large enough for FTIR analysis. Because KOH etch is highly selective to a semiconductor material such as silicon, the exposed dielectric film will have very little degradation, if any. The wax is then removed and optionally, ion milling both sides of the film can also be done to clean the sample.

The foregoing description of the preferred embodiment of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A method of determining the composition of a dielectric film on a semiconductor device wherein said semiconductor device comprises a dielectric film on a semiconductor substrate, wherein said method comprises:

removing a portion of said substrate leaving only a portion of dielectric film; and performing a compositional analysis of said portion of dielectric film.

2. The method of claim 1 wherein said step of removing a portion of said substrate comprises the steps of:

creating a crater in the substrate, said crater having a center; and selectively chemically etching the center of said crater, leaving only dielectric film in the center of said crater.

3. The method of claim 2, wherein said step of performing a compositional analysis comprises the step of performing a spectral analysis.

4. The method of claim 2, wherein said step of performing a compositional analysis comprises the step of performing an infrared spectral analysis.

5. The method of claim 2, wherein said step of performing a compositional analysis comprises the step of performing a Fourier transform spectral analysis.

* * * * *